United States Patent
Kato et al.

(10) Patent No.: US 8,044,511 B2
(45) Date of Patent: Oct. 25, 2011

(54) FUNCTION ELEMENT AND FUNCTION ELEMENT MOUNTING STRUCTURE

(75) Inventors: Kenichi Kato, Kirishima (JP); Yoshio Shimoaka, Kirishima (JP)

(73) Assignee: Kyocera Corporation, Kyoto (JP)

( * ) Notice: Subject to any disclaimer, the term of this patent is extended or adjusted under 35 U.S.C. 154(b) by 523 days.

(21) Appl. No.: 11/572,796

(22) PCT Filed: Jul. 29, 2005

(86) PCT No.: PCT/JP2005/013951
§ 371 (c)(1),
(2), (4) Date: Dec. 7, 2007

(87) PCT Pub. No.: WO2006/011601
PCT Pub. Date: Feb. 2, 2006

(65) Prior Publication Data
US 2008/0136018 A1    Jun. 12, 2008

(30) Foreign Application Priority Data

Jul. 29, 2004 (JP) ................. 2004-221283
Jan. 27, 2005 (JP) ................. 2005-020258

(51) Int. Cl.
*H01L 23/48* (2006.01)
(52) U.S. Cl. .................. 257/737; 257/E23.06
(58) Field of Classification Search .......... 257/737, 257/E23.06
See application file for complete search history.

(56) References Cited

U.S. PATENT DOCUMENTS

| | | | |
|---|---|---|---|
| 6,028,011 A | 2/2000 | Takase et al. | 438/745 |
| 6,462,415 B1 | 10/2002 | Ishiguri et al. | |

FOREIGN PATENT DOCUMENTS

| | | |
|---|---|---|
| JP | 09069524 A | 3/1997 |
| JP | 10130852 A | 5/1998 |
| JP | 11-214421 | 8/1999 |
| JP | 2001196404 A | 7/2001 |
| JP | 2002237497 A | 8/2002 |
| JP | 2004172390 A | 6/2004 |
| JP | 2004-200247 | 7/2004 |
| JP | 2004200247 A | 7/2004 |

OTHER PUBLICATIONS

Japanese language office action dated Sep. 21, 2010 and its partial English language translation for corresponding Japanese application 2006527874 lists the reference above.

*Primary Examiner* — Samuel Gebremariam
(74) *Attorney, Agent, or Firm* — DLA Piper LLP (US)

(57) ABSTRACT

The semiconductor device is manufactured by forming a lower electrode layer 2 having a predetermined pattern on a semiconductor substrate 1 and forming an upper electrode layer 3 on a part of the top surface of the lower electrode layer 2, while holes 2X extending in the direction of thickness are formed on the top surface of the lower electrode layer 2 below the upper electrode layer 3, and the depth of holes 2X is smaller than the thickness of the lower electrode layer 2.

9 Claims, 11 Drawing Sheets

FUNCTION ELEMENT AND FUNCTION ELEMENT MOUNTING STRUCTURE

BACKGROUND OF THE INVENTION

1. Field of the Invention

The present invention relates to a functional device, a method for manufacturing the same, and a functional device mounting structure.

2. Description of the Related Art

A functional device such as semiconductor device requires electrodes for the connection to a power source and for exchanging electrical signals. Conventional electrodes formed on functional devices include such a type that an upper electrode layer such as nickel film is formed on a lower electrode layer made of aluminum or the like. For example, Japanese Unexamined Patent Publication (Kokai) No. 11-214421 discloses that an aluminum electrode is formed as the lower electrode layer on a semiconductor substrate, zinc is caused to precipitate thereon by means of a zincate treatment solution in which sodium hydroxide and zinc oxide are dissolved, and electroless plating of nickel is carried out so as to form a nickel film as the upper electrode layer.

In the conventional electrodes, however, the lower electrode layer and the substrate are not sufficiently bonded, and there is a possibility of the lower electrode layer peeling off the substrate.

SUMMARY OF THE INVENTION

Accordingly, an object of the present invention is to provide a functional device having increased bonding strength between the electrode and the substrate.

The functional device of the present invention includes a lower electrode layer in a predetermined pattern formed on one principal surface of a substrate and an upper electrode layer formed on a part of the lower electrode layer, wherein holes are formed so as to extend in the direction of thickness in the interface region between the lower electrode layer and the upper electrode layer, and depth of the holes is smaller than the thickness of the lower electrode layer.

It is preferable that the holes are filled with a part of the upper electrode layer.

It is also preferable that the lower electrode layer is covered by a protective layer which surrounds the upper electrode layer, while a part of the upper electrode layer fills a recess which extends along the plane in the interface region between the protective layer and the lower electrode layer.

It is also preferable that a solder layer is formed on the upper electrode layer.

It is further preferable that a gold (Au) layer is formed on the upper electrode layer.

The functional device mounting structure of the present invention is characterized in that a pad for mounting the functional device of the present invention is provided on one principal surface of the substrate which has a circuit wiring formed thereon, while the pad and the upper electrode layer (or the solder layer or the gold layer formed thereon) of the functional device are electrically connected with each other, thereby mounting the functional device on the substrate.

A method for manufacturing a functional device of the present invention comprises a first step of forming a lower electrode layer having a predetermined pattern on one principal surface of a substrate; a second step of forming a protective layer so that a part of the top surface of the lower electrode layer is exposed; a third step of removing an oxide film formed on the exposed portion of the lower electrode layer; a fourth step of immersing the substrate in a zincate treatment solution so as to form holes in the exposed portion of the lower electrode layer; and a fifth step of immersing the substrate in an electroless plating solution so as to form the upper electrode layer on the lower electrode layer.

It is preferable that the substrate is a semiconductor substrate, and the other principal surface of the semiconductor substrate is polished and an oxide film is formed on the other principal surface of the semiconductor substrate which has been exposed after polishing, before the third step.

The present inventors found that one of causes of low bonding strength between the lower electrode layer and the substrate was the formation of a number of through holes which penetrate the lower electrode layer from the top surface to the bottom surface as shown in FIG. 5. In case a number of through holes are formed in the lower electrode layer, it is difficult for the metal which forms the upper electrode layer to precipitate down to the deepest portion of the through hole in the lower layer. As a result, void may be formed near the deepest portion of the through hole in the lower layer. When there is such a void, bonding area between the substrate and the lower electrode layer decreases by an area corresponding to the void, thus decreasing the bonding strength between the substrate and the lower electrode layer. In the substrate of the present invention, although a plurality of holes is formed in the lower electrode layer, many of the holes do not penetrate to the substrate. Therefore, the bonding area between the substrate and the lower electrode layer can be suppressed from decreasing, thereby increasing the bonding strength. Moreover, when the holes are filled with part of the upper electrode layer, peel-off is less likely to occur also between the upper electrode layer and the lower electrode layer. Thus in the functional device provided on the substrate which has a circuit wiring formed thereon, the electrode is less likely to peel off even when the upper electrode layer is under thermal stress or the like.

Since the depth of the holes is less than that of the through holes, even the vicinity of the deepest portion of the holes can be filled with a part of the upper electrode layer. Thus the chemical solution used in the manufacturing process such as zincate treatment solution or etching solution can be prevented from remaining in this portion. Furthermore, because the recess of the lower electrode layer formed in the interface region with the protective layer is also filled with a part of the upper electrode layer, the chemical solution can be prevented from remaining here. As a result, the lower electrode layer and the upper electrode layer can be suppressed from being corroded by the chemical solution.

The method for manufacturing a functional device of the present invention makes it possible to obtain the functional device in which peel-off is less likely to occur between the substrate and the lower electrode layer and between the lower electrode layer and the upper electrode layer, even when thermal stress is applied to solder bumps formed on the upper electrode layer.

In case the substrate is a semiconductor substrate, as mentioned above, it is preferable to polish the bottom surface of the semiconductor substrate and form an oxide film on the surface of the semiconductor substrate which has been exposed after polishing, before the step of electroless plating. Therefore, even when metal dust sticks to the bottom surface of the semiconductor substrate, the metal dust can be removed and the semiconductor substrate which has been polished can be prevented from being exposed. Thus the plating material can be prevented from precipitating on the metal dust and the exposed portion of the semiconductor substrate.

It is also made possible to apply plating only to the top surface of the lower electrode layer which is the intended object of plating, by preventing the plating material from being precipitated on the metal dust. As a result, it is made possible to effectively suppress the precipitation time from becoming longer and a protrusion called nodule from being generated, when the plating material is precipitated on the top surface of the lower electrode layer. Thus the desired upper electrode layer can be stably formed on the top surface of the lower electrode layer within a predetermined period of time.

DESCRIPTION OF REFERENCE NUMERALS

|  |  |
| --- | --- |
| 1: | semiconductor substrate |
| 2: | lower electrode layer |
| 2X: | hole |
| 2Y: | recess |
| 3: | upper electrode layer |
| 4: | protective layer |
| 5: | Zn particles |
| 6: | substrate |
| 7: | circuit pattern |
| 8: | pad |
| 9: | solder layer |
| 10: | sealing resin |
| 21: | ball shear sensor |
| 22: | shearing tool |
| 23: | stage |
| S: | oxide film |
| K: | void |
| M: | shear strength measuring instrument |

DESCRIPTION OF THE PREFERRED EMBODIMENTS

The functional device of the present invention will now be described in detail by taking a semiconductor device as an example with reference to the accompanying drawings.

Figure 1:
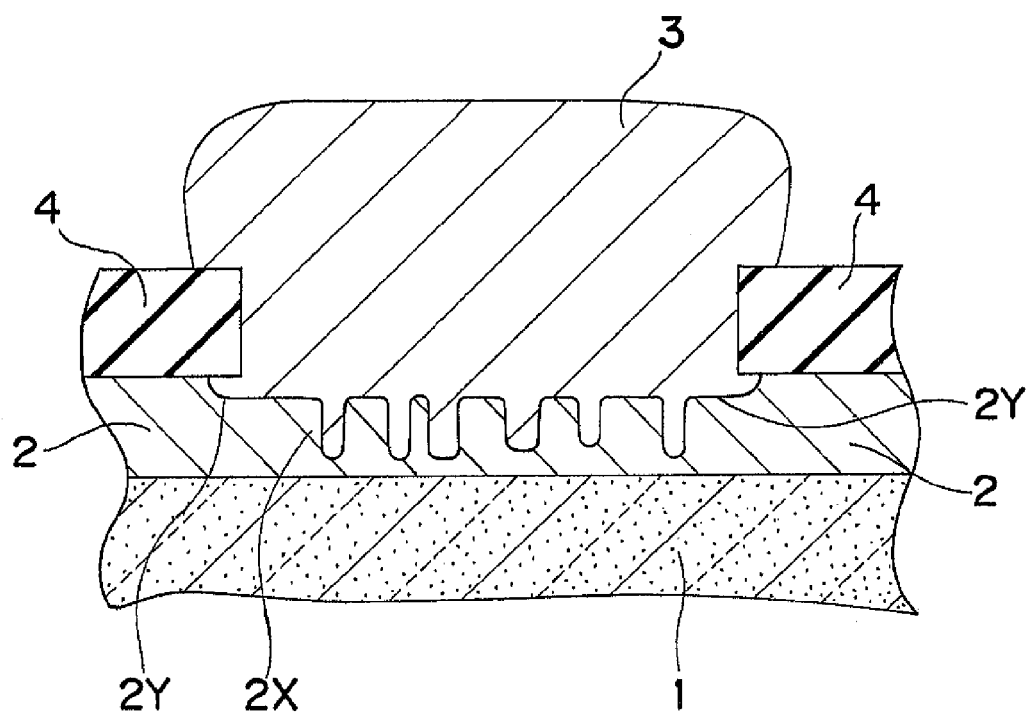
FIG. 1 is a partial sectional view of a semiconductor device according to an embodiment of the present invention.
Figure 2:
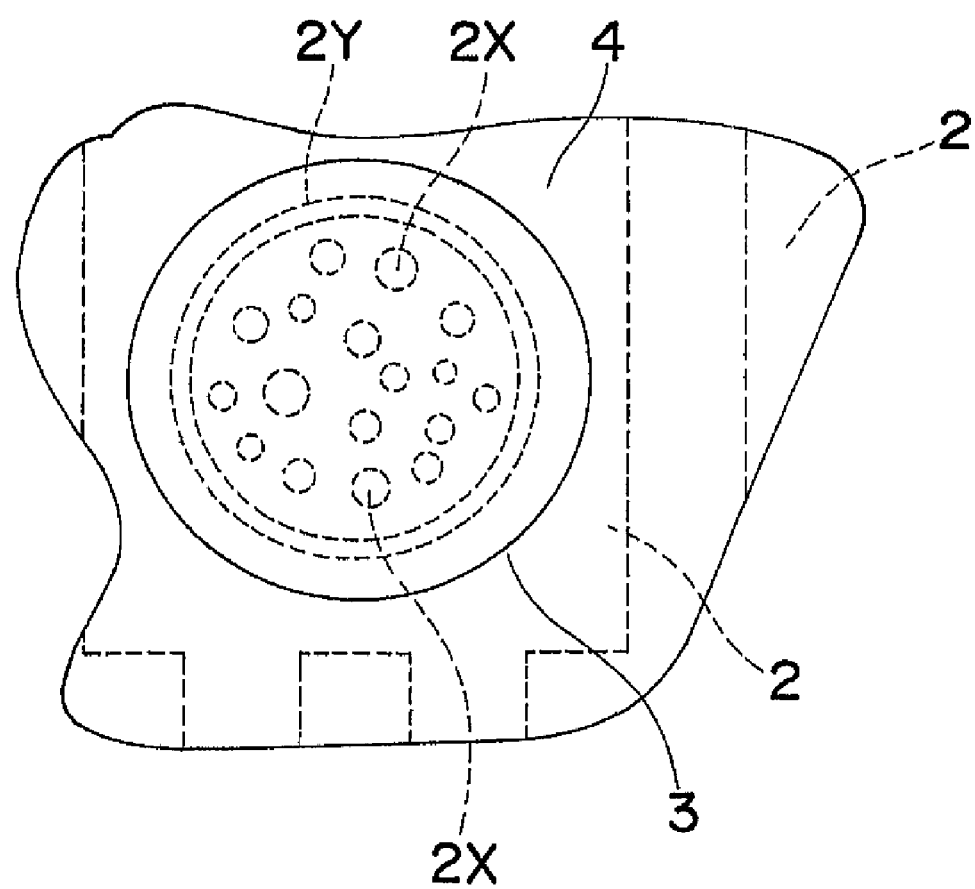
FIG. 2 is a partial plan view explanatory of the semiconductor device shown in FIG. 1.

FIG. 1 is a partial sectional view of the semiconductor device which is an example of the functional device according to the present invention. The semiconductor device shown in FIG. 1 comprises a semiconductor substrate 1, a lower electrode layer 2, an upper electrode layer 3 and a protective layer 4. Formed on the surface of the semiconductor substrate 1 which constitutes the semiconductor device are the lower electrode layer 2 which achieves the semiconductor function and the upper electrode layer 3 which is electrically connected to the lower electrode layer 2. The protective layer 4 is provided on the semiconductor substrate 1 to cover the lower electrode layer 2. A part of the lower electrode layer 2 is exposed from the protective layer 4, and the upper electrode layer 3 is formed on the exposed portion. A plurality of holes 2X is formed in the interface region between the lower electrode layer 2 and the upper electrode layer 3. The holes 2X are filled with the upper electrode layer 3.

The semiconductor substrate 1 is made of, for example, single crystal silicon. Inside of the semiconductor substrate 1, integrated functional circuits such as transistors formed of P-type region, N-type region and insulation region, as required, and electrode layers to provide electrical connection between these functional circuits may be formed. The substrate has the lower electrode layer 2, the upper electrode layer 3 and the protective layer 4 deposited on one principal surface thereof.

The lower electrode layer 2 in a predetermined pattern formed on the semiconductor substrate 1 is preferably formed from a metal such as Al, Al—Cu, Al—Si, Al—Si—Cu or the like, having thickness from 0.5 to 2.0 µm. The lower electrode layer 2 functions as an electrode for connection to external circuits to supply electric power, electric signals or the like. A part of the lower electrode layer 2 is exposed at the protective layer 4. The exposed portion has a circular shape, for example, having a diameter preferably in a range from 40 to 100 µm. The top surface of the lower electrode layer 2 in the exposed portion is preferably about 5 nm to 50 nm lower than the top surface of the lower electrode layer 2 located right below the protective layer 4.

In the lower electrode layer 2 located below the protective layer 4 which surrounds the exposed portion, it is preferable to form the recess 2Y measuring, for example, 5 nm to 50 nm in width and 5 nm to 50 nm in depth which extends substantially horizontally along the interface region between the lower electrode layer and the protective layer 4. In case the lower electrode layer 2 exposed from the protective layer 4 has circular shape in plan view, the recess 2Y has a ring shape.

A plurality of holes 2X is formed in the top surface of the lower electrode layer 2 in the exposed portion. The holes 2X extend from the top surface of the lower electrode layer 2 toward the inside of the lower electrode layer 2, but do not reach the top surface of the semiconductor substrate 1. As a result, since the bonding area between the semiconductor substrate 1 and the lower electrode layer 2 does not decrease, the bonding strength does not decrease. Thus even when the lower electrode layer 2 is subjected to stress as a semiconductor device is mounted on the substrate having the circuit wiring formed thereon, peel-off is less likely to occur also between the semiconductor substrate 1 and the lower electrode layer 2. Even when some of the holes 2X reach the top surface of the semiconductor substrate 1, the effect described above can be achieved if mean depth of the holes 2X is smaller than the thickness of the lower electrode layer 2.

The depth of the hole 2X is preferably in a range roughly from 50 nm to 200 nm. While the holes 2X extend substantially downward, there may be bending portion. Presence of bending portion increases the bonding strength between the lower electrode layer 2 and the upper electrode layer 3. Density of the holes 2X is preferably about 1 hole per $\mu m^2$ to 20 holes per $\mu m^2$ in plan view. The diameter of the hole 2X is preferably from about 10 nm to 500 nm.

The upper electrode layer 3 is formed on the lower electrode layer 2. The upper electrode layer 3 which is electrically connected to the lower electrode layer 2 is formed by coating with a metal such as Ni (nickel). The upper electrode layer 3 plays the roles of having the electrode protrude from the protective layer 4 and, when the semiconductor substrate 1 is mounted on a circuit structure via a solder layer, prevent the material of the lower electrode layer 2 from diffusing into the solder layer.

It is preferable that the upper electrode layer 3 covers the top surface of the lower electrode layer 2 and, at the same time, a part of the upper electrode layer 3 fills the holes 2X down to near the deepest portion thereof. This enables it to suppress zincate treatment solution or etching solution which has entered during the semiconductor device manufacturing process from remaining in the portion near the deepest portion of the holes 2X. As a result, the lower electrode layer 2 and the upper electrode layer 3 can be suppressed from being corroded by the liquid. It is also preferable that the recess 2Y which extends substantially horizontally along the interface region between the lower electrode layer and the protective layer 4 is filled with the upper electrode layer 3. This also suppresses the chemical liquid from remaining.

Since a part of the upper electrode layer 3 fills the holes 2X of the lower electrode layer 2, bonding strength between the upper electrode layer 3 and the lower electrode layer 2 can be increased. As a result, when the semiconductor substrate 1 is mounted on an external device which has a circuit wiring, the upper electrode layer 3 is less likely to be peeled off the lower electrode layer 2 even when the upper electrode layer 3 is pulled upward or sideways by an external force. The upper electrode layer 3 becomes even less likely to be peeled off the lower electrode layer 2 when the holes 2X have portions where the diameter varies and/or the hole bends. Moreover, when the recess 2Y of the lower electrode layer 2 is also filled with the upper electrode layer 3, effect of suppressing the peel-off becomes even higher when the upper electrode layer 3 is pulled by an external force.

Figure 5:
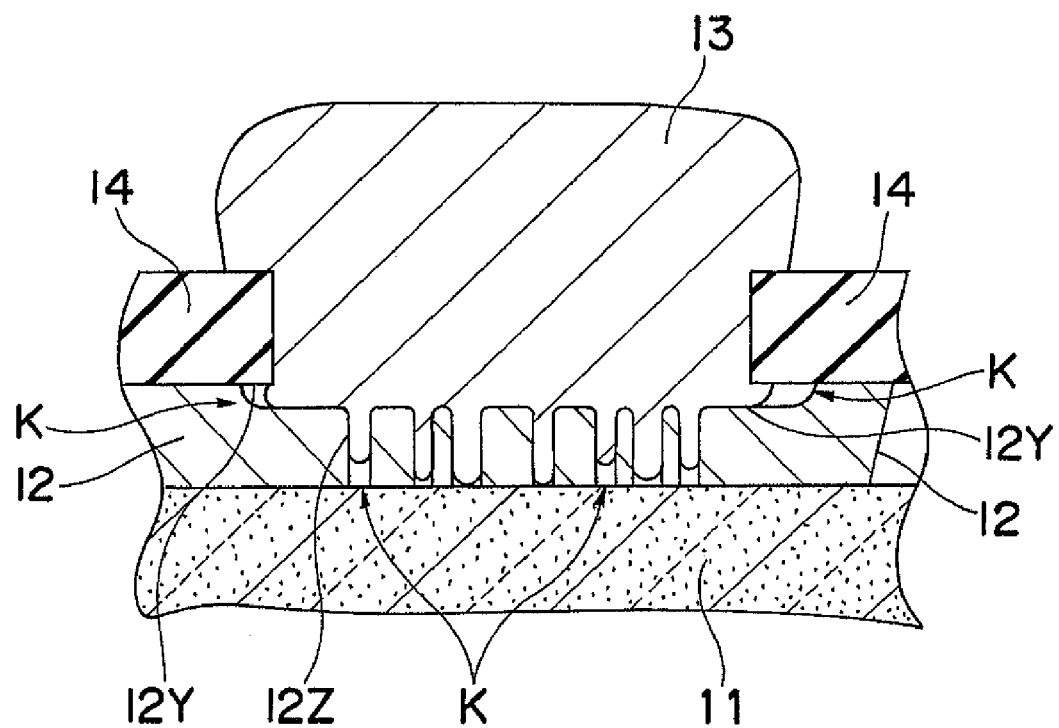
FIG. 5 is a partial sectional view of the semiconductor device.

In case holes 12Z penetrate through the lower electrode layer 12 and reach the semiconductor substrate 11 as shown in FIG. 5, in contrast, bonding strength between the lower electrode layer 12 and the semiconductor substrate 11 decreases. In the case of the semiconductor device shown in FIG. 5, multitude of through holes 12Z are formed to extend from the top surface to the bottom surface of the lower electrode layer 12. The upper electrode layer 13 partially fills in the through holes 12Z. In a region right below a protective layer 14 which surrounds the lower electrode layer 12 of the exposed portion, a recess 12Y is provided to extend along the plane in the interface region between the protective layer 14 and the lower electrode layer 12.

The metal which forms the upper electrode layer 13 is not fully precipitated down to the deepest portion of the through holes 12Z formed in the lower electrode layer 12, and therefore a void K may be formed in a portion near the deepest portion of the through holes 12Z. Also Ni is not fully precipitated in a portion near the distal end of the recess 12Y formed in the interface region between the protective layer 14 and the lower electrode layer 12, thus resulting in the formation of void K. When there is such a void K, bonding area between the semiconductor substrate 11 and the lower electrode layer 12 decreases by an area corresponding to the void, thus decreasing the bonding strength between the layers.

Even when Ni is fully precipitated down to the deepest portion of the through holes 12Z, bonding strength between the top surface of the semiconductor substrate 11 and the lower electrode layer 12 cannot be sufficiently suppressed from decreasing. This is because the bonding strength between the upper electrode layer 13 which is precipitated by electroless plating and the semiconductor substrate 11 is smaller than the bonding strength between the lower electrode layer 12 which is precipitated by a thin film forming technology such as sputtering or CVD (chemical vapor deposition) and the semiconductor substrate 11. As a result, when the semiconductor substrate 1 is mounted on a substrate which has a circuit wiring formed thereon, the semiconductor substrate 11 and the lower electrode layer 12 are likely to peel off from each other as an external force is applied to the lower electrode layer 12.

In case there is the void K near the deepest portion of the through holes 12Z, the liquid used in the manufacturing process such as zincate treatment solution or an etching solution may remain in the void K, thus giving rise to the possibility of corrosion. The problem of residual chemical liquid may occur also in the recess 12Y formed in the lower electrode layer 12 in the interface region thereof with the protective layer 14. When the void K is formed in a portion near the distal end of the recess 12Y, the chemical liquid may remain in the void K and cause corrosion.

In the semiconductor device shown in FIG. 1, the protective layer 4 which covers the top surface of the lower electrode layer 2 is formed on the semiconductor substrate 1 so as to expose the upper electrode layer 3. The protective layer 4 can be formed from an electrically insulating material such as silicon nitride ($Si_3N_4$), silicon oxide ($SiO_2$) or polyimide. Since the protective layer 4 covers a part of the lower electrode layer 2 surrounding the upper electrode layer 3, the protective layer 4 swells upward in the covering portion to become higher than the other portion. The protective layer 4 effectively shields the functional circuit provided on the semiconductor substrate 1 and the lower electrode layer 2 from the atmosphere, so as to effectively prevent these members from being corroded by the moisture included in the atmosphere. The protective layer 4 can be formed on the top surface of the semiconductor substrate 1 by a known thin film forming technology, with thickness of 0.5 to 2.0 µm.

Method for Manufacturing Functional Device

An example of method for manufacturing the functional device of the present invention will now be described, by taking semiconductor substrate as an example with reference to FIGS. 3A to 3E.

Step (a)

Figure 3A:
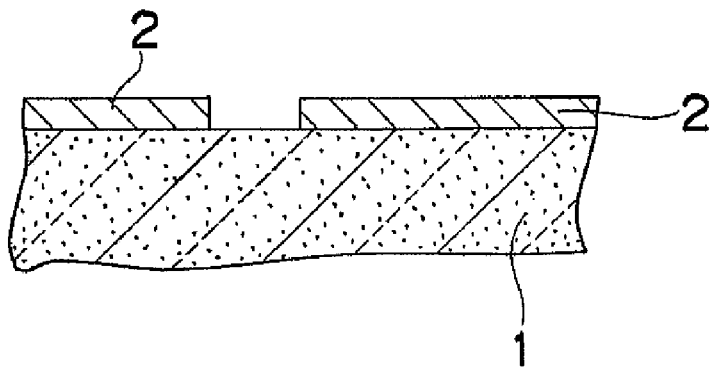
FIG. 3A is a partial sectional view explanatory of a step in a method for manufacturing a semiconductor device shown in FIG. 1.

First, as shown in FIG. 3A, the lower electrode layer 2 is formed in a predetermined pattern on the semiconductor substrate 1 having integrated functional circuit formed thereon.

The lower electrode layer 2 is made by forming a film by sputtering or the like and forming the film in the predetermined pattern by photolithography process.

Step (b)

Figure 3B:
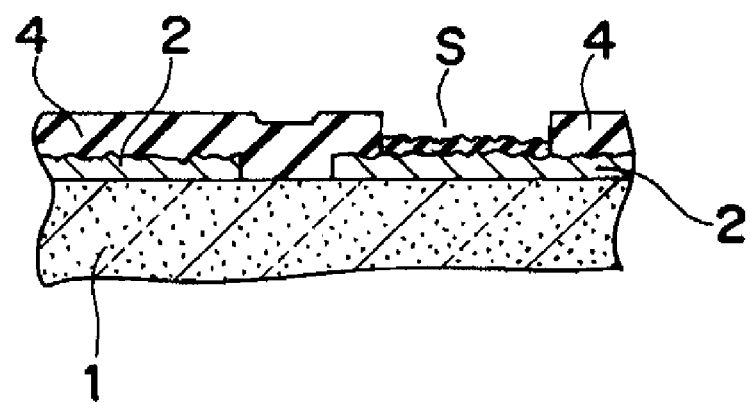
FIG. 3B is a partial sectional view showing a step next to FIG. 3A.

Then as shown in FIG. 3B, the protective layer 4 is formed by sputtering so as to cover the entire surface of the lower electrode layer 2, followed by photolithography process to form a predetermined opening in the protective layer 4 so as to expose a part of the lower electrode layer 2. The upper electrode layer 3 is formed in the exposed portion. During the sputtering process, the semiconductor substrate is heated. The heat treatment applied during the process of forming the protective layer results in the formation of protrusion called hillock on the exposed surface of the lower electrode layer. In the exposed surface of the lower electrode layer where the protrusion is formed, an oxide film S of $Al_2O_3$ (alumina) is formed through oxidization of the material forming the lower electrode layer such as Al, since heat treatment is applied during the process of forming the protective layer. The exposed surface of the lower electrode layer is rough in this state, from 0.01 to 0.02 μm in terms of arithmetic mean surface roughness. The thickness of the oxide film S also has variation.

The steps (c) to (e) will be described in which the upper electrode layer 13 is formed by electroless plating process.

Step (c)

Figure 3C:
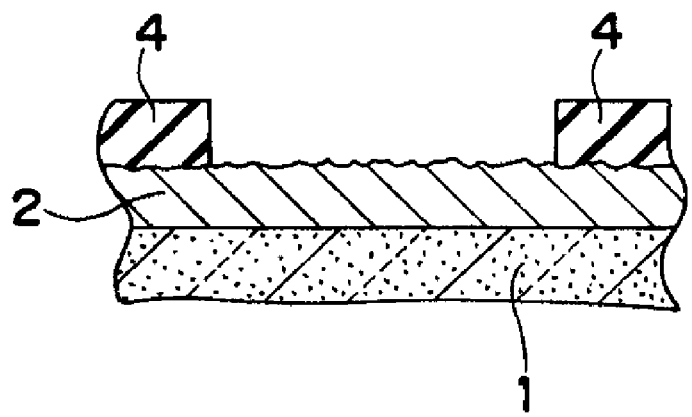
FIG. 3C is a partial sectional view showing a step next to FIG. 3B.

Then as shown in FIG. 3C, the exposed surface of the lower electrode layer is dry-etched. Prior to the dry etching, wet etching may be carried out to remove fat or other material deposited on the semiconductor device and decrease the thickness of the oxide film. Dry etching of this process is carried out for the purpose of removing the oxide film S which has variation in thickness, so that Al which constitutes the lower electrode layer 2 is exposed over substantially the entire surface.

After the step (c) and before the next step (d), a spontaneous oxidization film (not shown) having uniform thickness is formed on the lower electrode layer 2 through contact with oxygen in the air. The spontaneous oxidization film has a thickness smaller and variation in thickness smaller than those of the oxide film S formed by the effect of the heat described above.

Step (d)

Figure 3D:
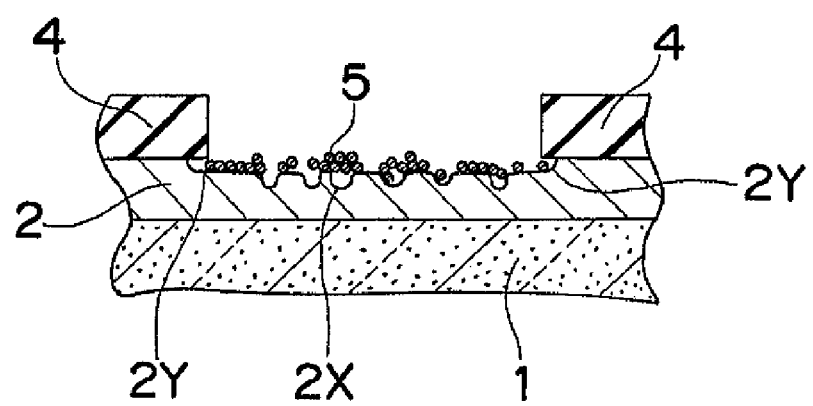
FIG. 3D is a partial sectional view showing a step next to FIG. 3C.

Then as shown in FIG. 3D, the semiconductor device is immersed in a zincate treatment solution. At this time, the spontaneous oxidization film having substantially uniform thickness formed upon completion of the step (c) is removed first by the etching effect of the zincate treatment. As the spontaneous oxidization film is removed, substantially the entire surface of the lower electrode layer 2 is exposed while Al which constitutes the lower electrode layer 2 is substituted in the exposed surface by Zn which is the catalyst metal included in the zincate treatment solution, so as to precipitate fine Zn particles 5.

Some of the spontaneous oxidization film remains on the Al surface of the lower electrode layer. The lower electrode layer located below the remaining spontaneous oxidization film is exposed in the zincate treatment solution with a little delay following the exposed region described above. As a result, dissolution of Al by the cell action proceeds more conspicuously than the action of substituting Al with Zn, in the newly exposed region, namely the region where the spontaneous oxidization film remains, than in the region from which the spontaneous oxidization film has been removed. Thus the holes 2X are formed locally in the exposed region.

Etching of the lower electrode layer 2 proceeds not only in the direction of etching but also horizontally along the interface region between the protective layer 4 and the lower electrode layer 2, so that the ring-shaped recess 2Y in plan view is formed below the protective layer 4 which is adjacent to the exposed portion.

In the meantime, Zn particles 5 precipitate around the holes 2X, and the density of the Zn particles which are precipitated increases with time so as to cover the top surface of the holes 2X of the lower electrode layer. This makes it difficult to supply fresh zincate treatment solution into the holes 2X. As a result, progress of dissolution of Al of the lower electrode layer 2 by the cell action decreases, and the holes 2X are less likely to be formed to penetrate as the conventional through holes, even after the zincate treatment solution. Zn particles 5 partially precipitate also on the inner walls of the holes 2X and the recess 2Y.

Step (e)

Figure 3E:
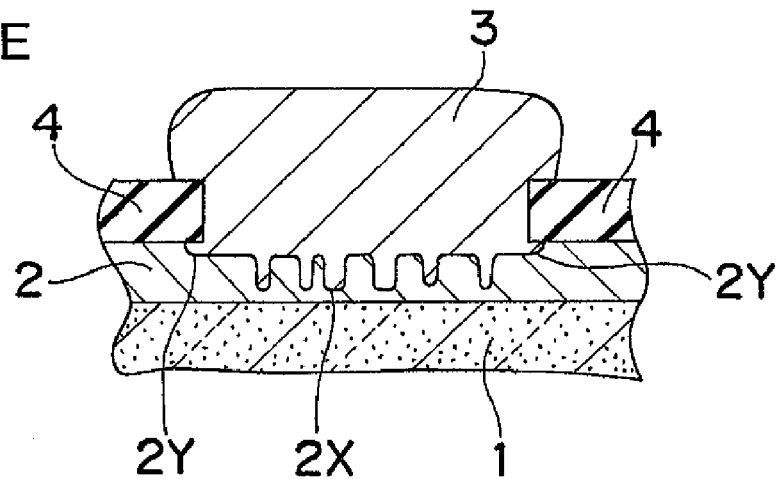
FIG. 3E is a partial sectional view showing a step next to FIG. 3D.

Last, the upper electrode layer 3 is formed as shown in FIG. 3E. In the step (e), the upper electrode layer 3 is formed from Ni on the exposed portion of the lower electrode layer 2 by electroless plating method. The Zn particles 5 precipitated on substantially the entire surface of the exposed portion of the lower electrode layer 2 and the Zn particles 5 precipitated also on the inner walls of the holes 2X and the recess 2Y are substituted by Ni. After the substitution, Ni layer grows by the self-catalyzing action of Ni so as to form the upper electrode layer 3.

The semiconductor device of the present invention is completed by the steps described above.

This manufacturing method makes the holes 2X less likely to be formed as through holes than in the case of the conventional manufacturing method. In addition to not penetrating through, number of processes of a zincate treatment and etching can be decreased in comparison to a method described below.

FIGS. 6A to 6E show the manufacturing method which exposes the lower electrode layer by a zincate treatment without applying dry etching. This method requires an increased number of a zincate treatment processes and is likely to result in the configuration shown in FIG. 5.

Figure 6A:
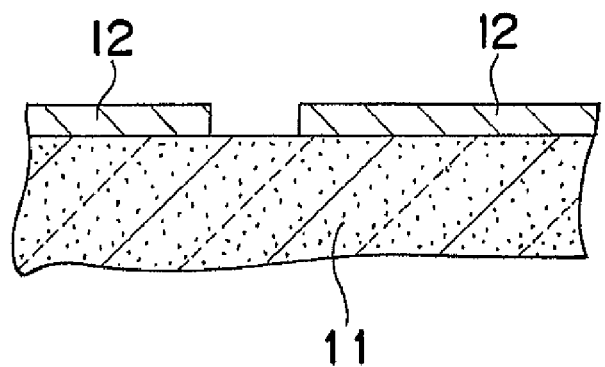
FIG. 6A is a partial sectional view explanatory of a step in a method for manufacturing a semiconductor device shown in FIG. 5.
Figure 6B:
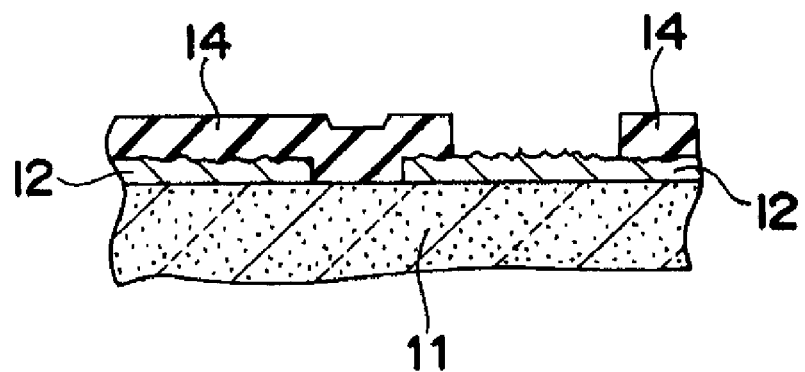
FIG. 6B is a partial sectional view showing a step next to FIG. 6A.

First, as shown in FIG. 6A, the lower electrode layer 12 is formed in a predetermined pattern on the semiconductor substrate 11, and is formed in the predetermined pattern by photolithography process. Then as shown in FIG. 6B, the protective layer 14 is formed so as to cover the entire surface of the lower electrode layer 12, followed by photolithography process to form a predetermined opening in the protective layer 14. The step is the same as that in the method described above up to this point, and oxide films (not shown) are formed on the lower electrode layer 12 through oxidization of the surface of the protrusion 12H such as hillock and the lower electrode layer 12. The thickness of the oxide film is large and has significant variation.

Figure 6C:
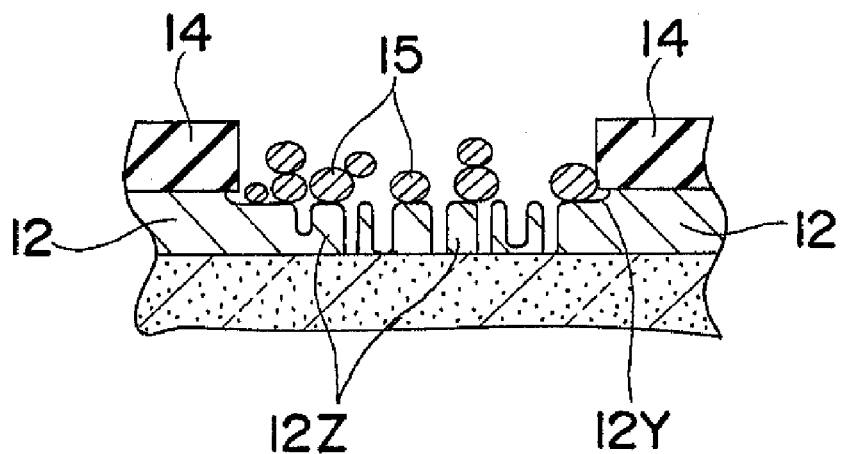
FIG. 6C is a partial sectional view showing a step next to FIG. 6B.

Then as shown in FIG. 6C, first zincate treatment is applied. First, fat or other material deposited on the top surface of the semiconductor device is removed. Then the semiconductor device is immersed in the zincate treatment solution, where the oxide film formed on the top surface of the upper electrode layer 12 is removed by etching effect. As the protrusion 12H of the lower electrode layer 12 is exposed in the zincate treatment solution in advance to the exposure of the other surface area of the lower electrode layer 12, the metal of the lower electrode layer 12 in the protrusion 12H is substituted by the catalyst metal included in the zincate treatment solution, for example Zn, so that the Zn particles 15 precipitate. As the Zn particles 15 grow in the region which has been occupied by the protrusion 12H through the precipitation of new Zn particles 15, while removal of the oxide film proceeds also in a portion which is not exposed yet. However, even when there is a newly exposed region as the removal process proceeds, the newly exposed region is subjected not only to precipitation of Zn through the substitution but also to conspicuous progress of dissolution of Al into the zincate treatment solution through the cell effect. Thus the through holes 12Z are formed so as to penetrate the lower electrode layer 12 in the newly exposed region. The etching effect of the zincate treatment also dissolves the lower electrode layer 12 located in the interface region with the protective layer 14, thus resulting in the formation of the recess 2Y which extends in the interface region with the protective layer 14.

Figure 6D:
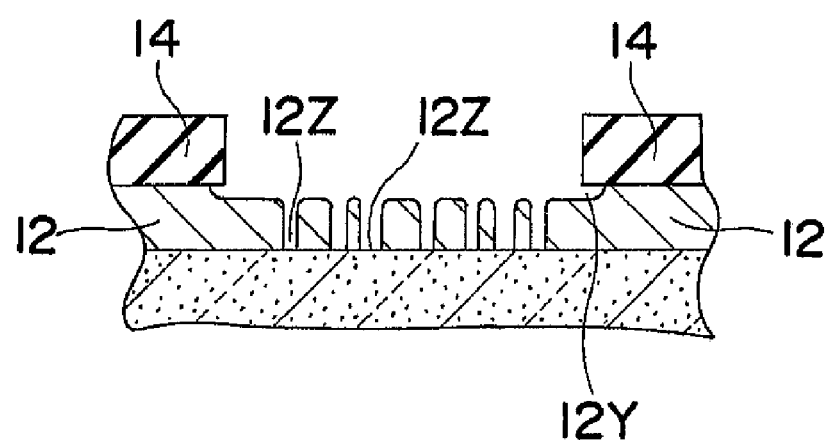
FIG. 6D is a partial sectional view showing a step next to FIG. 6C.

Then as shown in FIG. 6D, the Zn particles precipitated on the lower electrode layer 12 are removed by wet etching. This causes flat Al surface to reappear on the top. As the lower electrode layer 12 becomes flat on the top surface thereof except for the region where the through holes 12Z are formed, the oxide film which is formed through spontaneous oxidization of the top surface of the lower electrode layer 12 (spontaneous oxidization film) has substantially uniform thickness.

Figure 6E:
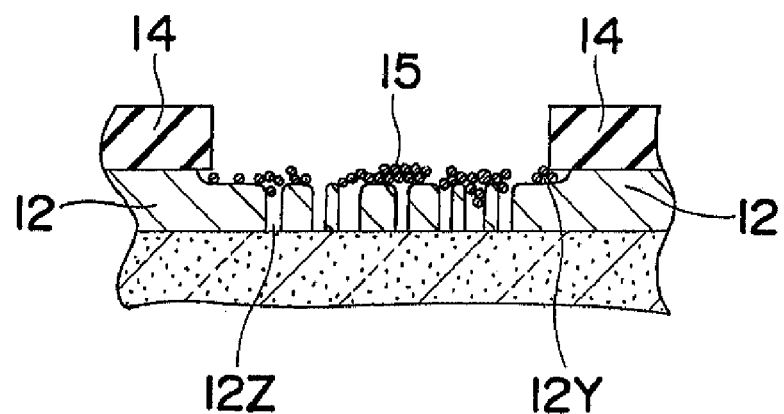
FIG. 6E is a partial sectional view showing a step next to FIG. 6D.
Figure 6F:
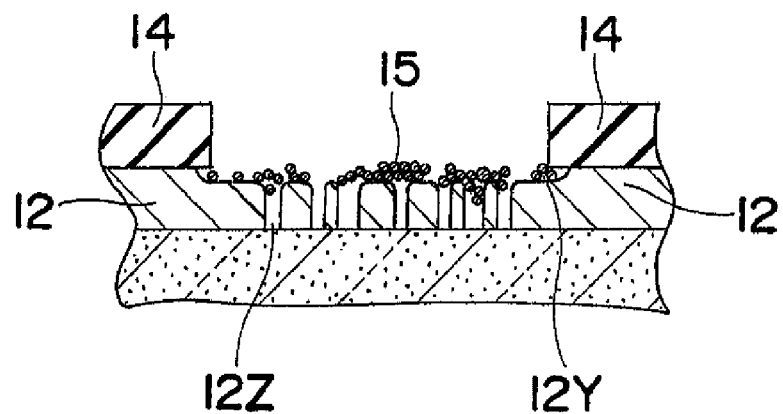
FIG. 6F is a partial sectional view showing a step next to FIG. 6E.

Then as shown in FIG. 6E, second zincate treatment is applied. Since the spontaneous oxidization film has substantially uniform thickness, the top surface of the lower electrode layer 12 as a whole is exposed in the zincate treatment solution substantially simultaneously as the spontaneous oxidization film is removed by the etching effect, so that the Zn particles 15 precipitate substantially uniformly over the entire surface of the lower electrode layer 12 except for the through holes 12Z. As a result, the Zn particles 15 become fine and located nearer to each other. When such fine Zn particles 15 are deposited near to each other, a layer of deposited Zn particles 15 is formed through precipitation in a relatively short period of time. While the Zn particles 15 precipitate also on the inner wall of the through holes 12Z, Zn may not fully precipitate near the deepest portion of the through holes 12Z.

Last, Ni which forms the upper electrode layer 13 is precipitated by electroless plating process on the inner wall of the through holes 12Z and the lower electrode layer 12. Forming the electrode in this way requires it to apply zincate treatment twice, which tends to increase the depth of the holes 12Z formed through the zincate treatment. As a result, many of the holes 12Z tend to penetrate and reach the semiconductor substrate 1. In this case, the metal that forms the upper electrode layer 13 does not fully precipitate near the deepest portion of the through holes 12Z which are formed in the lower electrode layer 12, and therefore voids K are likely to be formed in a portion near the deepest portion of the through holes 12Z. Also Ni is not fully precipitated in a portion near the distal end of the recess 12Y formed in the interface region between the protective layer 14 and the lower electrode layer 12, thus resulting in the formation of void K.

As described with reference to FIGS. 3A to 3E, it is preferable to apply the zincate treatment after making the thickness of the spontaneous oxidization film smaller and uniform by dry etching, which enables it to form the electrode having higher bonding strength and resistance to corrosion.

The manufacturing method of the present invention is not limited to the embodiment described above, and various modifications and improvements may be made without departing from the spirit of the present invention.

For example, in the embodiment described above, such a step as the other principal surface of the semiconductor substrate, opposite to that whereon the lower electrode layer is formed, and the side face are polished and oxide films are formed on as the other principal surface and the side face of the semiconductor substrate which have been exposed after polishing, may be interposed between the formation of the protective layer 4 (step (b)) and a series of electroless plating steps (d) to (e).

The polishing operation, which can be carried out by using a grinder equipped with a diamond grinding wheel, makes the other principal surface and the side face of the semiconductor substrate flat. The stock removal in this polishing operation is about 275 μm from the thickness of about 625 μm of the semiconductor substrate 1, leaving the thickness of the semiconductor substrate about 350 μm after polishing, in case the other principal surface of the semiconductor substrate is polished.

The oxide film can be formed by cleaning with pure water after polishing, and drying by blowing air. Thus oxide film (for example, $SiO_2$ film in the case of semiconductor substrate made of Si) having substantially uniform thickness can be formed on the other principal surface and the side face of the semiconductor substrate.

Through the step described above, the other principal surface and the side face of the substrate 1 can be put into satisfactory condition. Metal dust coming off a stage or an arm may deposit on the other principal surface and the side face of the semiconductor substrate or cause scratches thereon, when the semiconductor substrate is placed on the stage made of a metal of the manufacturing apparatus, or when the semiconductor substrate is moved by the arm made of a metal between manufacturing apparatuses, thus causing the inner material to be exposed on the surface of the semiconductor substrate. Even in such a case, the metal dust and scratches can be removed by the polishing operation. Also because the oxide film formed thereon performs masking function as a resist film during electroless plating process, the semiconductor substrate (for example, Si) which has been polished can be prevented from being exposed in the zincate treatment solution or the plating solution.

By preventing the plating material from precipitating on the metal dust, it is made possible to limit the plated area to the top surface of the lower electrode layer which is the intended object of plating. As a result, it is made possible to effectively suppress the precipitation time from becoming longer and a protrusion called nodule from being generated, when the plating material is precipitated on the top surface of the lower electrode layer. Thus the desired upper electrode layer can be stably formed on the top surface of the lower electrode layer within a predetermined period of time. Particularly when the metal dust and/or the scratch is larger than the upper electrode layer formed by the electroless plating, this effect is conspicuous. For example, in case the upper electrode layer formed by the electroless plating is about 50 μm in plan view and the metal dust and/or the scratch is as large as 200 μm in plan view, this effect is conspicuous.

Use of the oxide film as a mask makes it possible to eliminate masking treatment on the other principal surface and the side face of the semiconductor substrate by means of a dry film, a photo resist or a plating jig, after the polishing operation and before the electroless plating process, thus improving the productivity in the manufacture of the semiconductor device.

Functional Device Mounting Structure

The functional device mounting structure of the present invention will now be described below, by taking a semiconductor device mounting structure having the semiconductor device described above mounted thereon, as an example.

Figure 4:
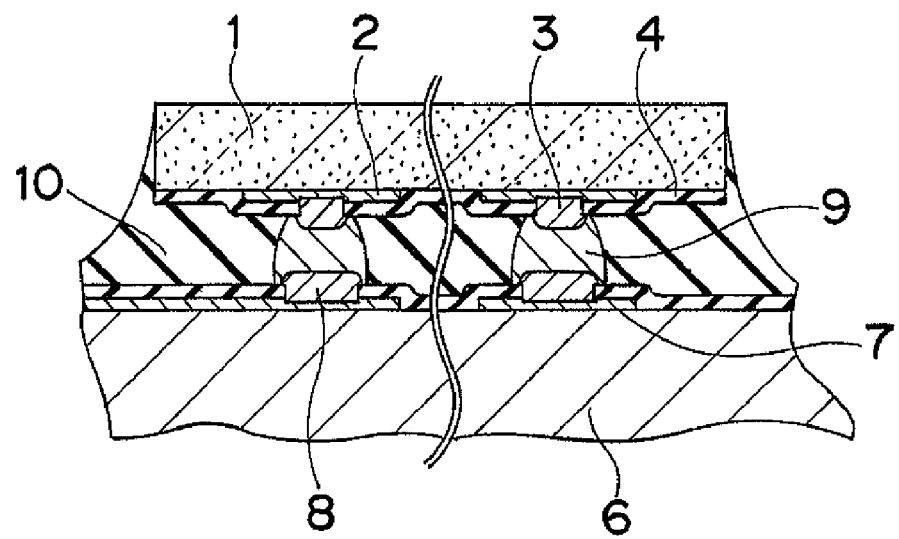
FIG. 4 is a partial sectional view of a functional device mounting structure according to the present invention.

The semiconductor device mounting structure mainly comprises the semiconductor device described above and a substrate 6 whereon the semiconductor device is mounted, as shown in FIG. 4. The substrate 6 has a circuit pattern 7 and pad 8 provided at predetermined positions of the circuit pattern 7, formed on the top surface thereof. The pad 8 and the upper electrode layer 3 of the semiconductor device are connected to each other by a solder layer 9. Alternatively, the pad 8 and a gold (Au) layer formed on the upper electrode layer 3 may be connected to each other by the solder layer 9. A sealing resin 10 may be placed between the semiconductor device and the substrate 6, after mounting the semiconductor device.

The substrate 6 of the semiconductor device mounting structure has a circuit pattern 7, via hole conductors, etc. which are formed from a metal such as aluminum, gold or copper inside and/or on the top surface thereof, while other electronic components and other functional devices are mounted thereon. The circuit pattern 7 is formed on the substrate 6 by running wires made of a metal such as aluminum, gold or copper in a predetermined pattern.

The material of the substrate 6 is selected according to the application and desired function, and may be such as an insulating material or a metallic material having one principal surface, whereon the semiconductor device is to be mounted, being oxidized. For example, in case the semiconductor device is used to control a thermal head, the substrate 6 may be formed from ceramics or glass-reinforced epoxy resin.

The circuit pattern 7 formed on one principal surface of the substrate 6 is made of an electrical conductor such as aluminum (Al), copper (Cu) or gold (Au), and it suffices that a region for forming the pad 8 to be described later is secured in one principal surface of the substrate 6. The circuit pattern 7 may be formed to extend to the other principal surface, or may be connected to the via hole conductors formed in the substrate 6. The circuit pattern 7 may be formed by the known photolithography process or the thick film printing process.

The pad 8 formed on a part of the top surface of the circuit pattern 7 may be formed by the electroless plating process, similarly to the upper electrode layer 3 of the semiconductor device.

The solder layer 9 can be formed on the upper electrode layer 3 of the semiconductor device by, for example, applying a solder paste by a known printing method and heating the paste to melt. The gold layer can be formed on the upper electrode layer 3 by employing the electroplating process or the electroless plating process. In this case, the gold plating solution may be prepared by using a sulfurous acid compound or an electroless plating solution which includes gold, reducing agent, stabilizer and buffer agent.

To mount the semiconductor device on the substrate 6, the principal surface of the substrate 6 where the pad 8 is formed and the surface of the semiconductor device whereon the upper electrode layer 3 is formed are disposed to face each other, and are put together so that the upper electrode layer 3 is located on the pad 8 of the substrate 6.

Then the upper electrode layer 3 is put into contact with the pad 8, and the upper electrode layer 3 is heated to melt so as to join with the pad 8. This process may be carried out by heating the metal layer such as upper electrode layer 3 or the solder layer 9 which is to be joined with the pad 8, by a known method such as electric furnace, ultrasound or irradiation with laser beam.

Last, a sealing resin 10 is placed between the semiconductor device and the substrate 6, so as to cover the junction. While a known material such as epoxy resin is used for the sealing resin 10, viscosity of the resin is set to a low value since it is required to fill a narrow space of about 10 to 100 μm between the semiconductor device and the protective layer 4.

The present invention is not limited to the embodiment described above, and various modifications and improvements may be made without departing from the spirit of the present invention. For example, instead of the example described above, a thin gold (Au) layer may be formed after forming the upper electrode layer 3, and a solder layer may be formed thereon. Formation of the gold layer makes it possible to suppress oxidization and corrosion of the nickel surface of the upper electrode layer until the solder layer is formed. Such a method may also be employed, although not shown in the drawing, as the upper electrode layer and the pad are disposed to face each other and, the gap therebetween is filled with an electrically conductive film having anisotropy and achieve thermal fusion.

In this case, too, even when thermal stress due to a difference in thermal expansion coefficient between the semiconductor substrate 1 and the substrate 6 is generated between the semiconductor substrate 1 and the lower electrode layer 2, between the lower electrode layer 2 and the upper electrode layer 3 and between the circuit pattern 7 and the pad 8, peel-off is less likely to occur between these members. Similar effect can be achieved also when an undesired force other than the thermal stress is applied.

While the semiconductor device is used as the functional device in the embodiment described above, the functional device may also be an SAW device made by forming an electrode layer on a piezoelectric substrate, instead of the semiconductor device.

Example 1

In Example 1, an experiment was conducted to investigate the relationship between the proportion of the through holes to the sum of the through holes and the holes and the bonding strength between the lower electrode layer and the upper electrode layer.

1. Preparation of Samples

First, samples Nos. 1 to 6 were prepared as the semiconductor device subjected to the experiment. Sample No. 1 was made by the conventional manufacturing method, and other samples were made by the manufacturing method of the present invention.

Samples Nos. 2 to 6 were subjected to dry etching as in the step (c) of the manufacturing method of the present invention, with the duration of etching varied from sample to sample. Duration of etching was about 1 minute for sample No. 2, about 5 minutes for sample No. 3, about 10 minutes for sample No. 4, about 20 minutes for sample No. 5 and about 30 minutes for sample No. 6. Conditions of dry etching were set in common for samples Nos. 2 to 6: ultimate vacuum was 0.2 Pa, hydrogen (purity 99.99%) was used as the etching gas, gas flow rate was 100 ml/min, gas pressure was 20 Pa and RF power was 300 W.

2. Method of Counting the Holes (Through Holes)

(1) First, sections of the lower electrode layer located right below the upper electrode layer was cut at 5 positions for each of samples Nos. 1 to 6 by means of a focused ion beam system. The cut section measured approximately 20 μm in width and 5 μm in thickness.

(2) Then an arbitrarily selected point in the cut section was observed under a scanning electron microscope (acceleration voltage was 15.00 kV and magnification factor was 10,000 times), and a photograph showing the section about 10 μm in width was obtained.

(3) Numbers of the holes and the through holes formed in the lower electrode layer were counted in the photograph, and ratio of numbers of through holes/(numbers of holes and through holes) was calculated.

3. Shear Strength Test

In order to evaluate the bonding strength between the lower electrode layer and the upper electrode layer in samples Nos. 1 to 6, solder bumps 9 having substantially spherical shape were formed on the upper electrode layer, and shear strength test was conducted in the state of having the solder bumps 9.

Figure 7:
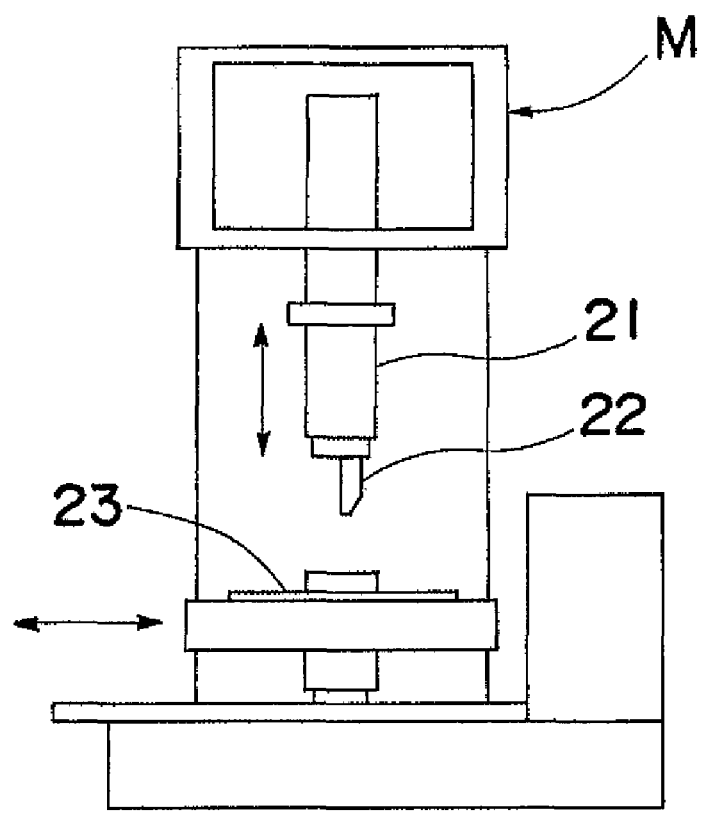
FIG. 7 is a schematic side view of a shear strength measuring instrument used in Examples of the present invention.

Shear strength test was conducted by using a shear strength measuring instrument M (PTR-1000 manufactured by RHESCA Co., Ltd.) shown in FIG. 7. The shear strength measuring instrument M has a ball shear sensor 21 and a shearing tool 22, which are supported to be movable in vertical direction. Samples Nos. 1 to 6 on which the solder bumps 9 were bonded, were placed on a stage 23. The stage 23 was movable in the horizontal direction.

Figure 8:
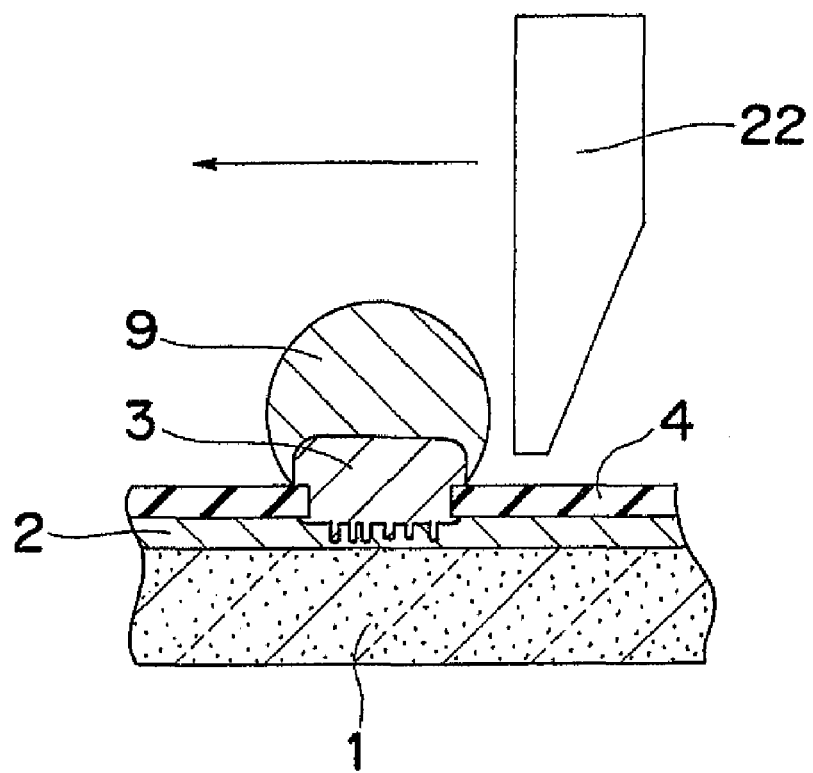
FIG. 8 is a schematic side view showing the setup for shear strength test carried out in Examples of the present invention.

First, samples Nos. 1 to 6 in which the solder bumps 9 were provided on the upper electrode layer 3, were placed on the stage 23 as shown in FIG. 8. The solder bump 9 in this Example had a diameter from 40 to 100 μm, and the opening in the protective layer 4 had a diameter from 40 to 100 μm.

The shearing tool 22 was lowered to a position just short of touching the surface of the protective layer 4 and, after memorizing the position of the surface of the semiconductor device, the shearing tool 22 was moved upward by a predetermined distance (about 10 μm).

Then the stage 23 was moved in horizontal direction at a speed of 25 μm/sec, so that the shearing tool 22 pressed the solder ball 9 sideways and passed over the junction. Thus the lower electrode layer 2 and the upper electrode layer 3 were caused to peel off each other on each solder bump. The area of the lower electrode layer 2 from which the upper electrode layer 3 was removed, namely the area of the lower electrode layer 2 which was exposed by peeling was measured. Then the proportion of peeled-off area (area of the lower electrode layer 2 exposed/area of the upper electrode layer before peeling) was calculated for each solder bump.

The shear strength test was conducted on 100 solder bumps in each of samples Nos. 1 to 6.

4. Results

The relationship between the proportion of the through holes to the sum of the through holes and the holes and the bonding strength between the lower electrode layer and the upper electrode layer is shown in Table 1.

TABLE 1

| | Sample No. | | | | | |
|---|---|---|---|---|---|---|
| | 1 | 2 | 3 | 4 | 5 | 6 |
| Number of through holes/(number of through holes + number of holes) | 25/25<br>26/26<br>23/23<br>25/25<br>24/24 | 20/23<br>21/25<br>19/22<br>20/22<br>18/23 | 10/21<br>10/19<br>11/19<br>10/22<br>10/20 | 4/17<br>5/18<br>4/18<br>5/17<br>4/16 | 1/12<br>1/14<br>1/13<br>2/15<br>1/12 | 0/13<br>0/10<br>0/12<br>0/11<br>0/12 |
| Mean of number of through holes/(number of through holes + number of holes) | 100% | 82.5% | 50.5% | 25.6% | 9.1% | 0% |
| Evaluation of shear strength test | D | C | C | B | A | A |

With regard to the 100 solder bumps in each of samples Nos. 1 to 6, sample in which 90 or more solder bumps showed the proportion of peeled-off area of the upper electrode layer 3 of 50% or more was ranked as "D", sample in which 90 or more solder bumps showed the proportion of peeled-off area of the upper electrode layer 3 of 25% or more and less than 50% was ranked as "C", sample in which 90 or more solder bumps showed the proportion of peeled-off area of the upper electrode layer 3 of 1% or more and less than 25% was ranked as "B", and sample in which 90 or more solder bumps showed no peel-off at all was ranked as "A".

From the Example, it was found that the longer the etching time in the step (c) is, the smaller the proportion of the through holes to the sum of the through holes and holes becomes while the larger the proportions of the holes becomes. It was also found that the lower electrode layer and the upper electrode layer become less likely to peel off each other as the number of the through holes decreases and the number of holes increases.

What is claimed is:

1. A functional device comprising:
   a substrate,
   a lower electrode layer formed on a principal surface of the substrate and
   an upper electrode layer formed on a part of a top surface of the lower electrode layer,
   wherein a plurality of holes are formed in the lower electrode layer so as to extend from an interface region between the lower electrode layer and the upper electrode layer in the direction of thickness of the lower electrode layer, and wherein some of said plurality of holes go through said lower electrode layer to said substrate and some of said plurality of holes have a depth smaller than the thickness of the lower electrode layer.

2. The functional device according to claim 1, wherein the holes are filled with a part of the upper electrode layer.

3. The functional device according to claim 1, wherein a protective layer which surrounds the upper electrode layer is provided on the lower electrode layer, and a part of the upper electrode layer fills a recess which extends in a plane along an interface region between the protective layer and the lower electrode layer.

4. The functional device according to claim 1, wherein a solder layer is formed on the upper electrode layer.

5. The functional device according to claim 1, wherein a gold (Au) layer is formed on the upper electrode layer.

6. A functional device mounting structure comprising:
   a substrate having a circuit wiring,
   a pad formed on a principal surface of the substrate, and
   the functional device described in any one of claims 1 to 5 mounted on the substrate so that the upper electrode layer is connected to the pad.

7. The functional device according to claim 1, wherein a protective layer which surrounds the upper electrode layer is provided on the lower electrode layer so that a portion of the lower electrode is exposed from the protective film, and wherein the holes are dispersed in the exposed portion of the lower electrode apart from the inner periphery of the exposed portion.

8. The functional device according to claim 1, wherein the thickness of the ldwer electrode is 0.5 to 2 μm.

9. The functional device according to claim 1, wherein a ratio of (the number of holes going through the lower electrode to the substrate)/(the number of holes going through the lower electrode to the substrate+the number of holes having a depth smaller than the thickness of the lower electrode layer) is not greater than 25.6 %.

* * * * *